United States Patent
Lee et al.

(10) Patent No.: US 6,867,145 B2
(45) Date of Patent: Mar. 15, 2005

(54) METHOD FOR FABRICATING SEMICONDUCTOR DEVICE USING PHOTORESIST PATTERN FORMED WITH ARGON FLUORIDE LASER

(75) Inventors: Sung-Kwon Lee, Ichon-shi (KR); Sang-Ik Kim, Ichon-shi (KR); Chang-Youn Hwang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 261 days.

(21) Appl. No.: 10/320,718

(22) Filed: Dec. 17, 2002

(65) Prior Publication Data

US 2003/0181054 A1 Sep. 25, 2003

(30) Foreign Application Priority Data

Dec. 17, 2001 (KR) ................................ 10-2001-0080242
Jun. 29, 2002 (KR) ................................ 10-2002-0037254

(51) Int. Cl.[7] ........................................... H01L 21/302
(52) U.S. Cl. ...................... 438/706; 438/710; 438/711; 438/714; 216/58; 216/67
(58) Field of Search ................................. 438/706, 710, 438/712, 711, 714, 723, 740; 216/58, 63, 67, 79

(56) References Cited

U.S. PATENT DOCUMENTS

| | | | | |
|---|---|---|---|---|
| 6,368,979 B1 | * | 4/2002 | Wang et al. ................. | 438/723 |
| 6,380,096 B2 | * | 4/2002 | Hung et al. ................. | 438/723 |
| 6,602,434 B1 | * | 8/2003 | Hung et al. .................... | 216/39 |
| 6,803,318 B1 | * | 10/2004 | Qiao et al. .................. | 438/700 |

FOREIGN PATENT DOCUMENTS

KR    2000-45442    7/2000    .......... H01L/21/28

* cited by examiner

*Primary Examiner*—Lan Vinh
(74) *Attorney, Agent, or Firm*—Mayer, Brown, Rowe & Maw LLP (57) ABSTRACT

The present invention provides a method for fabricating a semiconductor device with use of an ArF light source capable of minimizing deformations of a photoresist pattern for ArF during an etching process. Also, when forming the pattern, $C_5F_8$ gas is used at a main etching step to compensate etch tolerance of the photoresist for ArF. By controlling process recipe properly, it is possible to minimize pattern deformations as simultaneously as to form a micronized pattern. To compensate the etch tolerance of the photoresist for ArF weaker than that of a photoresist for KrF, the main etching step is divided into three sub-steps, thereby providing a method for minimizing the pattern deformations when duplicating the pattern.

30 Claims, 6 Drawing Sheets

METHOD FOR FABRICATING SEMICONDUCTOR DEVICE USING PHOTORESIST PATTERN FORMED WITH ARGON FLUORIDE LASER

FIELD OF THE INVENTION

The present invention relates to a method for fabricating a semiconductor device; and, more particularly, to a method for fabricating a semiconductor device by using a photoresist pattern formed through a photo-exposure with ArF laser.

DESCRIPTION OF RELATED ARTS

A photolithography technology contributes to progressions of a semiconductor device development. Thus, improvement on resolution of this technique is critically and directly related to a further progression in integration of a semiconductor device.

As known, the photolithography process includes a process for forming a photosensitive film pattern and a process for forming a pattern in a preferred form, e.g., a contact hole by etching an etch target layer with use of the photosensitive film pattern as an etch mask. The photosensitive film pattern is formed through a series of sequential processes as the following: a process for coating a photosensitive film on an etch target layer; a photo exposure process for photo-exposing the photosensitive layer through the use of a prepared photo-exposure mask; and a process for photo-exposing with use of a predetermined chemical solution or a developing process for removing areas of the photosensitive film that are not photo-exposed.

Meanwhile, a critical dimension (hereinafter referred as to CD) of a pattern formed by the photo-etching process depends on wavelengths of a light source used in the photo-etching process. It is because a width of the photosensitive film pattern established through the photo-etching process determines the CD of the actual pattern.

Stepper is a photo exposure equipment, which takes "step and repeat" photo-exposure type using wavelengths of a light source in a range from 436 nm (g-line) to 365 nm (i-line) in an initial stage of the practice. Currently, Stepper that uses a deep ultra violet (DUV) of a wavelength of 248 nm (KrF Excimer Laser), or scanner type photo exposure equipment is generally used. The photo-etching technique that uses the DUV of the wavelength in 248 nm initially has several problems of a time delay, a substrate dependence and so forth, resulting in numerous attempts to develop new types of photo-exposure equipments that providing variable pattern sizes for broad applications. For instance, a photo-exposure equipment having 0.18 $\mu$m of a pattern size was developed to solve the above-mentioned problems. In addition, in order to develop the photo-exposure equipment applicable to a pattern size less than 0.15 $\mu$m, it is compulsory to develop a new DUV photo-etching technology having a wavelength of 193 nm (ArF Excimer Laser). However, although other various techniques are combined together to improve resolution of the new DUV photo etching technique, a pattern size less than 0.1 $\mu$m is impossible to obtain. Therefore, it has been vigorously proceeded to develop an etching process having a new light source.

It is a current aim to develop a photo-exposure equipment using ArF Excimer Laser of which wavelength is in 193 nm so as to attain a pattern size of 0.11 $\mu$m. The DUV photo-etching technique is superior on an i-line resolution and DOF performance, but difficult to control-a process. This problem is resulted from an optical aspect caused by using a short wavelength and a chemical aspect caused by using a chemical amplification type of a resist. A CD fluctuation phenomenon due to a standby wave effect and an exposure phenomenon by a reflected light due to a substrate phase become more severe when an operating wavelength becomes shorter. The CD fluctuation means a periodic change in a line thickness because a degree of interference between an incident light and a reflected light fluctuates in accordance with a micro-thickness difference between resists or substrate films. In the DUV process, it is inevitable to use the chemical amplification type of the resist to improve sensitivity. However, there are several problems with respect to reaction mechanisms in post exposure delay (PED) safety, substrate dependence and so forth. Hence, one of key goals of the photo-exposure technique is to develop a resist for ArF. The resist for ArF is a chemical amplification type as like KrF, but a material used for the resist for ArF is basically necessary to be improved. It is, however, difficult to improve properties of the material since a benzene ring cannot be used. The benzene ring is especially employed to the i-line and the resist for KrF to provide tolerance to a dry etching. However, if the benzene ring is used in the resist for ArF, it is impossible to obtain a photo-exposure from a bottom part of the resist for ArF due to a decrease of transparency caused by increasing absorbance at 193 nm of the ArF Excimer Laser. Therefore, it is currently focused on a development of a material that provides strong tolerance to the dry etching, a good adhesiveness and an ability to be developed in 2.38% tetra methyl ammonium hydroxide (TMAH). Many companies and research institutes have been reported their studies on developments of the material having such effects.

For instance, a photoresist in a form of cycloolefin-maleic anhydride (COMA) commonly used in the photoresist for ArF or acrylate based polymer, or mixtures of the COMA and the acrylate based polymer has the benzene ring structure.

Accordingly, there occur striations of a pattern during an etching process for forming a landing plug contact (hereinafter referred as to LPC) for contacting an active area to an upper conductive layer with use of the ArF photolithography or clusters of a photoresist (PR) and plastic deformation during a self align contact (hereinafter referred as to SAC) etching process. Also, the PR is shifted to one side due to low tolerance of the PR during the SAC etching process. However, accurate mechanisms for these phenomena have not been discovered yet. Hence, low tolerance of the photoresist for ArF and low materialistic properties should be urgently complemented.

Fluorine based etch gas is used to obtain an etch profile in the SAC process. There occur deformations of the photoresist pattern due to the above-described fragility of the photoresist pattern. These types of photoresist pattern deformation become more severe when an isolated photoresist pattern is used during the SAC process. Meanwhile, in case of a photoresist pattern used in forming a contact hole as an example of the isolated photoresist pattern, there occur problems of inducing a contact open defect or decreasing a contact area, thereby increasing contact resistance when employing an etching process with a consideration of etch tolerance of the photoresist pattern.

Therefore, when performing a process for forming a pattern such as a contact hole, it is very important to control appropriately the etch gas and the etch target layer at the etching step. Particularly, it is important to minimize deformations of the photoresist pattern at an initial etching step defining a predetermined number of patterns through duplications of the pattern from the photoresist.

SUMMARY OF THE INVENTION

It is, therefore, an object of the present invention to provide a method for fabricating a semiconductor device by using an ArF light source capable of minimizing deformations of a photoresist pattern for ArF.

In accordance with an aspect of the present invention, there is provided a method for fabricating a semiconductor device with use of an ArF light source, including the steps of: forming an etch stop layer and an insulating layer sequentially on a substrate; forming an anti-reflective coating layer on top of the insulating layer; forming a photoresist pattern on the anti-reflective coating layer by performing a photo-etching process using a photoresist for ArF and a ArF light source; exposing the insulating layer by etching the anti-reflective coating layer through the use of the photoresist pattern as an etch mask; etching selectively a partial portion of the exposed insulating layer by using gas including $C_xF_y$ where x and y are integers ranging from 1 to 10; etching selectively the insulating layer until the partial portion of the insulating layer is remained on top of the etch stop layer by using gas including $C_xF_y$ and $C_aH_bF_c$ where a, b, and c are integers ranging from 1 to 10; removing the remaining insulating layer by using gas including $C_xF_y$; and removing selectively the etch stop layer and exposing a surface of the substrate so to form a predetermined number of patterns.

In accordance with another aspect of the present invention, there is provided A method for fabricating a semiconductor device with using an ArF light source, including the steps of: forming sequentially an insulating layer and an anti-reflective coating layer on a substrate providing a number of neighboring conductive patterns; forming a photoresist pattern defining a contact area on the anti-reflective coating layer by performing a photo-etching process using an ArF light source; forming a first opening part exposing a surface of the insulating layer by etching the anti-reflective coating layer with use of the photoresist pattern as an etch mask; forming a second opening part by etching the exposed insulating layer to a partial thickness with use of a mixed gas of $C_5F_8/O_2/Ar$ and the photoresist pattern as an etch mask; and forming a third opening part exposing a surface of the substrate between the conductive patterns by etching the remaining insulating layer with use of a mixed gas of $C_5F_8/CH_2F_2/O_2/Ar$ and the photoresist pattern as an etch mask.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

The present invention employs $C_5F_8$ gas at a major etching step when forming a pattern in order to compensate etch tolerance of a photoresist for ArF, which is weaker than a photoresist for KrF.

FIGS. 1A to 1D are cross-sectional views illustrating a process for forming a contact hole through a self align contact (SAC) etching process by using an ArF light source in accordance with a preferred embodiment of the present invention.

Figure 1A:
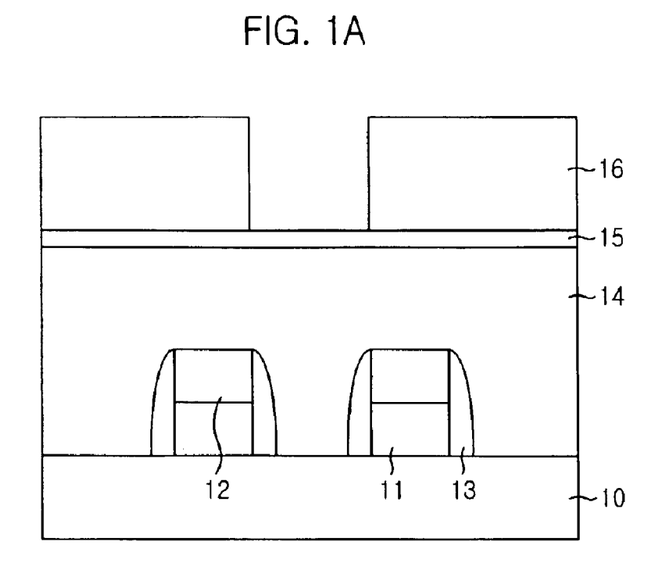
FIGS. 1A to 1D are cross-sectional views illustrating a process for forming a contact hole by using an ArF light source in accordance with a preferred embodiment of the present invention.

Referring to FIG. 1A, a number of conductive patterns 11 are formed on a substrate 10 providing various elements for constructing a semiconductor device. As an example for the conductive pattern 11, a gate electrode constructed by stacking polysilicon and silicide such as tungsten silicide is formed.

A hard mask 12 is formed on top of the conductive pattern 11 to prevent losses of the conductive pattern 11 occurring due to a subsequent SAC-process. The hard mask 12 is formed by using nitride.

Then, a spacer 13 is formed at lateral sides of the conductive pattern 11 and the hard mask 12.

An insulating layer 14 that uses an advanced planarization layer (APL) oxide layer, boro phospho silicate glass (BPSG), spin on glass (SOG) or a high density plasma (HDP) oxide layer is formed entirely on the above structure.

On top of the insulating layer 14, an anti-reflection coating layer 15 is formed by depositing organic-based material to a thickness ranging from about 100 Å to about 2000 Å. Thereafter, a photoresist for ArF is coated on the organic anti-reflection coating layer 15, and then a photoresist pattern 16 is formed through a photo-etching process using an ArF laser light source. In more detail, the photoresist for ArF such as cycloolefin maleic anhydride (COMA) or acrylate is coated to a thickness ranging from about 1000 Å to about 5000 Å. Then, a predetermined portion of the photoresist is selectively photo-exposed with use of the ArF light source (not shown) and a predetermined reticle (not shown). A developing process is proceeded after the selective photo-exposure. The photoresist pattern 16 is formed by removing etch remnants through a subsequent cleaning process.

Figure 1B:
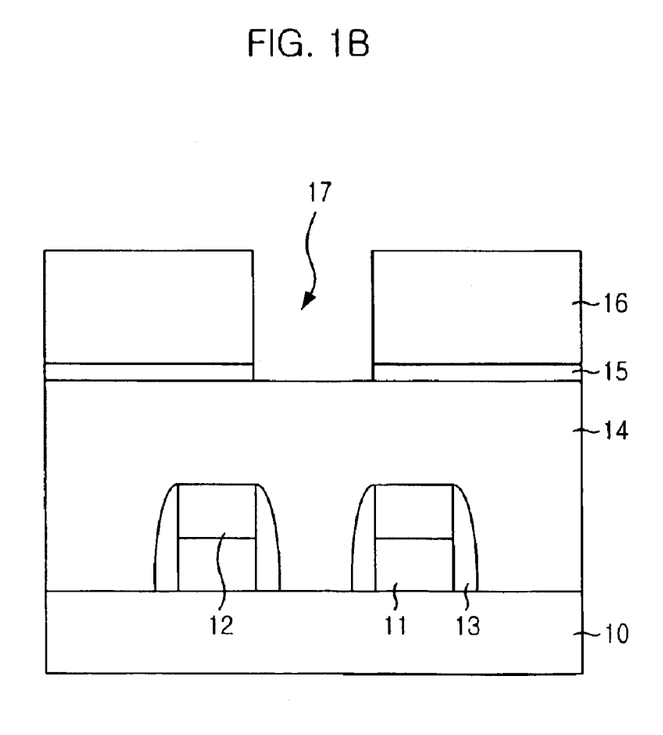

Referring to FIG. 1B, the organic anti-reflection coating layer 15 is selectively etched by maintaining a temperature of the substrate 10 in an appropriate range so to form a first opening part 17 exposing a surface of the insulating layer 14. At this-time, a dry etching process is carried out by using plasma generated from $CF_4/O_2$ or $N_2/O_2$ gas. $CF_4$ of which flow quantity ranges from about 50 sccm to about 200 sccm and $O_2$ of which flow quantity ranges from about 1 sccm to about 50 sccm are used. In case of using the $CF_4/O_2$, it is preferable to use a pressure ranging from about 20 mTorr to about 100 mTorr and a power ranging from about 300 W to about 1000 W. In case of using the $N_2/O_2$, $N_2$ of which flow quantity ranges from about 100 sccm to about 200 sccm and $O_2$ of which flow quantity ranges from about 1 sccm to about 50 sccm are used. It is also preferable to use a pressure ranging from about 1 mTorr to about 100 mTorr and a power ranging from about 300 W to about 1000 W. With the above process recipe, it is possible to minimize deformations of the photoresist pattern 16.

Figure 1C:
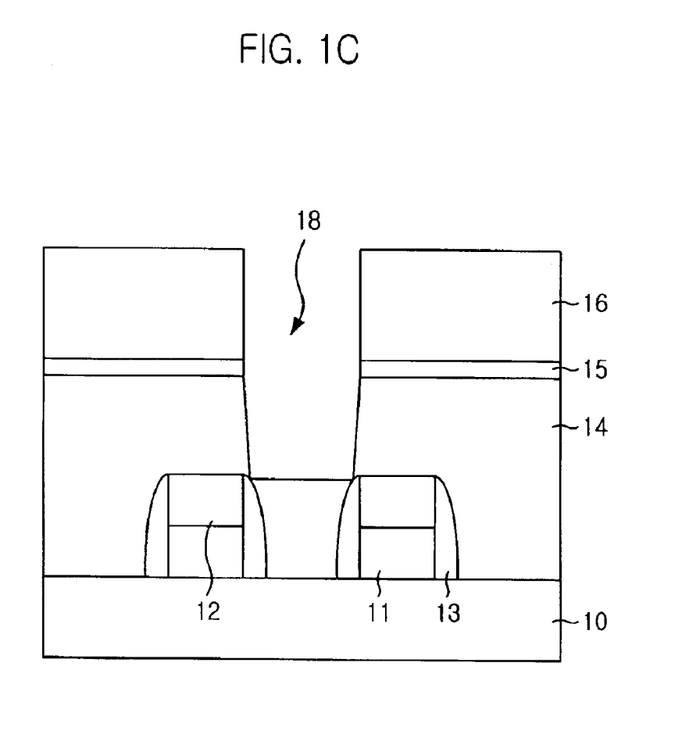

With reference to FIG. 1C, a second opening part 18 is formed by etching the insulating layer 14 to a certain thickness with use of plasma generated from a mixed gas of $C_5F_8/O_2/Ar$. At this time, $C_5F_8$ of which flow quantity ranges from about 10 sccm to about 30 sccm, $O_2$ of which flow quantity ranges from about 10 sccm to about 30 sccm and Ar of which flow quantity ranges from about 500 sccm to about 1500 sccm are used. Also, a pressure ranging from about 20 mTorr to about 100 mTorr and a power ranging from about 100 W to about 1800 W are used.

Hence, due to the above-described process recipe for producing polymers, it is possible to form the second opening part 18 having an inclination at its inner wall and to prevent deformations of the photoresist pattern 16.

Figure 1D:
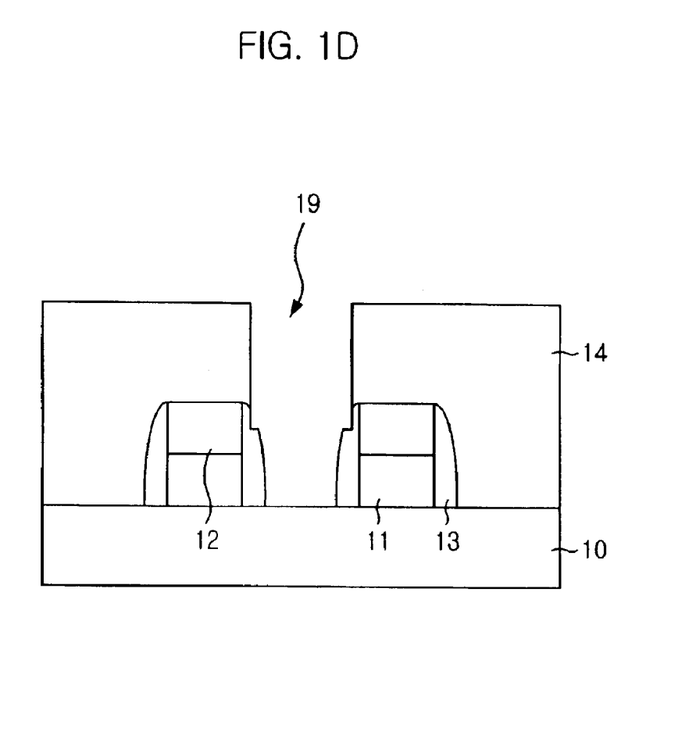

Referring to FIG. 1D, the insulating layer 14 is etched by using the plasma according to the mixed gas of $C_5F_8/CH_2F_2/O_2$/Ar. At this time, a temperature of the substrate 10 is maintained in an appropriate range. Herein, the photoresist pattern 16 is used as an etch mask. Through this etching process, a third opening part 19 exposing a surface of the substrate 10 is formed. At this time, each of the $C_5F_8$, $CH_2F_2$ and $O_2$ has a flow quantity ranging from about 10 sccm to about 30 sccm, while the Ar has a flow quantity ranging from about 500 sccm to about 1500 sccm. Also, a pressure ranging from about 20 mTorr to about 100 mTorr and a power ranging from about 800 W to about 1400 W are used.

An ashing process is proceeded to remove the photoresist pattern 16 and the organic anti-reflection coating layer 15. A cleaning process subsequent to the ashing process is performed to remove etch remnants, thereby minimizing pattern deformations as simultaneously as forming a good pattern, i.e., the third opening part 19. Herein, the preferred embodiment of the present invention exemplifies a self align contact (hereinafter referred as to SAC) process. A plug for connecting a subsequent storage node or a bit line is formed within the third opening part 19.

That is, it is possible to minimize deformations of the photoresist pattern for ArF in the etching process proceeded in accordance with the preferred embodiment of the present invention.

In another preferred embodiment of the present invention, the main etching step is divided into three sub-steps during the pattern formation to compensate etch tolerance of the photoresist for ArF weaker than a photoresist for KrF. This approach provides a method for minimizing deformations of the photoresist pattern particularly when duplicating the photoresist pattern.

For instance, in the preferred embodiment illustrating a contact hole pattern formation, etch gas including $CF_4$ is used to define a contact hole having a vertical profile when etching an oxide based insulating layer. Then, the oxide based insulating layer is etched until a certain portion of the oxide based insulating layer is remained by using etch gas including $C_4F_6$ and $CH_2F_2$. After this etching step, etch gas including $C_4F_6$ is used to remove the remaining oxide based insulating layer. By controlling process recipe such as flow quantities of each etch gas and added $O_2$, power and pressure, it is possible to minimize deformations of the photoresist pattern for ArF as simultaneously as forming the micronized pattern.

FIGS. 2A to 2H are cross-sectional views illustrating a process for forming a contact hole pattern with use of an ArF light source in accordance with another preferred embodiment of the present invention.

Figure 2A:
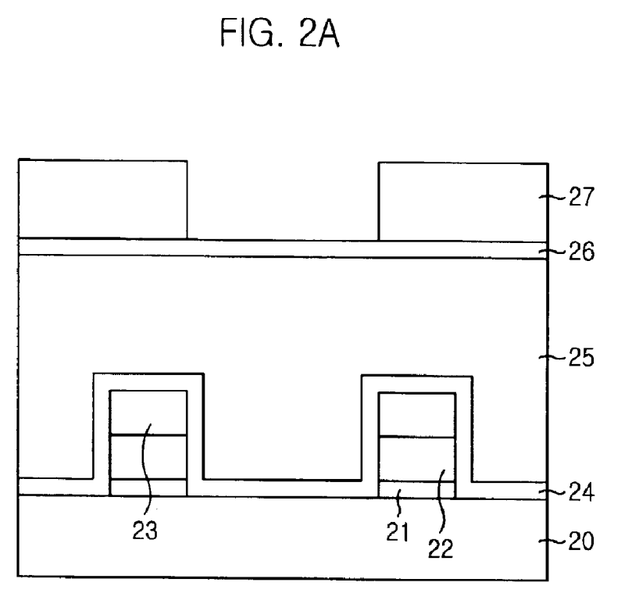
FIGS. 2A to 2H are cross-sectional views illustrating a process for forming a contact hole by using an ArF light source in accordance with another preferred embodiment of the present invention.

Referring to FIG. 2A, a number of conductive patterns 22 are formed on a substrate 20 providing various elements for constructing a semiconductor device. Herein, the conductive pattern 22 is formed through the use of a single layer or multi-stacked layers of a metal layer such as polysilicon, tungsten and so forth, a metal nitride layer such as tungsten nitride or metal silicide such as tungsten silicide. In this preferred embodiment of the present invention, a gate electrode is formed as an example of the conductive pattern. Also, a gate insulating layer 21, which is an oxide based layer, is formed at a contact interface between the substrate 20 and the gate electrode 22. On the gate electrode 22, a hard mask 23 is formed with a nitride layer to prevent losses of the gate electrode 22 through a subsequent SAC process.

Along an overall profile where the gate electrode 22 is formed, an etch stop layer 24 is formed with use of a nitride layer such as a silicon nitride layer or a silicon oxide-nitride layer. The etch stop layer 24 is for preventing losses of the hard mask 23 and the substrate 20 while performing the SAC process. Meanwhile, the etch stop layer is formed with a material having etch selectivity with respect to the insulating layer constructed mainly with an oxide based material in order to obtain a good etch profile during the SAC process.

Next, an inter-layer insulating layer 25 using an advanced planarization layer (APL) oxide layer, boro phospho silicate glass, spin on glass (SOG) or a high density plasma (HDP) oxide layer is formed on top of the above constructed structure.

An organic anti-reflective coating 26 is formed on the inter-layer insulating layer 25. During photo-exposure, which is a unique characteristic of the organic anti-reflective coating layer 26, an organic material is used to prevent scattered reflections as well as to easily obtain an etch selectivity to the photoresist for ArF and remove the photoresist pattern with easy. It is also preferable for the organic anti-reflective coating layer 26 to have a thickness ranging from about 100 Å to about 2000 Å.

The photoresist for ArF is coated on top of the organic anti-reflective coating layer 26. Then, a photoresist pattern 27 is formed through a photo-etching process using the ArF light source. In more detail, the photoresist for ArF, e.g., COMA or acrylate is coated on the organic anti-reflective coating layer 26 to a thickness ranging from about 1000 Å to about 5000 Å. A predetermined portion of the photoresist is selectively photo-exposed by using the ArF light source (not shown) and a predetermined number of reticles (not shown), and a developing process subsequent to the photo-exposure process let photo-exposed or no photo-exposed portions be remained. Then, the photoresist pattern 27 is formed by removing etch remnants through a cleaning process.

The preferred embodiment of the present invention provides a circular photoresist pattern 27 for forming a contact hole as an example. In addition to this circular shape, the photoresist pattern can have a bar type or T type.

Figure 2B:
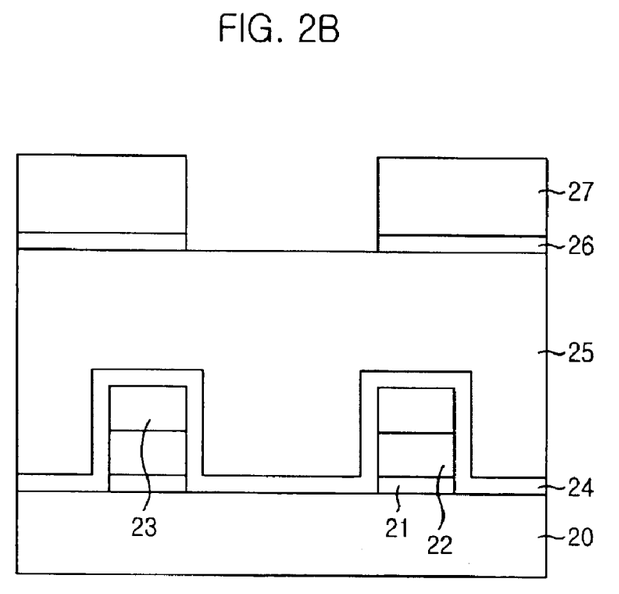

Referring to FIG. 2B, the organic anti-reflective coating layer 26 is selectively etched by using the photoresist pattern 27 as an etch mask while maintaining a temperature of the substrate 20 in an appropriate range so as to expose the inter-layer insulating layer 25.

At this time, optimum etching recipe is used to obtain etch tolerance of the photoresist pattern 27 and etch properties of the organic anti-reflective coating layer 26. Specifically, a dry etching process is employed with use of plasma including mixed gas of $CF_4$, $O_2$ and CO, which is an effective gas combination when being applied to the organic anti-reflective coating layer 26. At this time, a flow quantity of the $CF_4$ ranges from about 60 sccm to about 100 sccm while that of the $O_2$ ranges from about 10 sccm to about 30 sccm. Also, the CO has a flow quantity ranging from about 10 sccm to about 30 sccm. Furthermore, a pressure within a chamber is maintained in a range from about 25 mTorr to about 75 mTorr, and a power ranging from about 200 W to about 400 W is used. Additionally, a temperature of a cathode within the chamber is maintained in a range from about 15° C. to about 30° C.

Figure 2C:
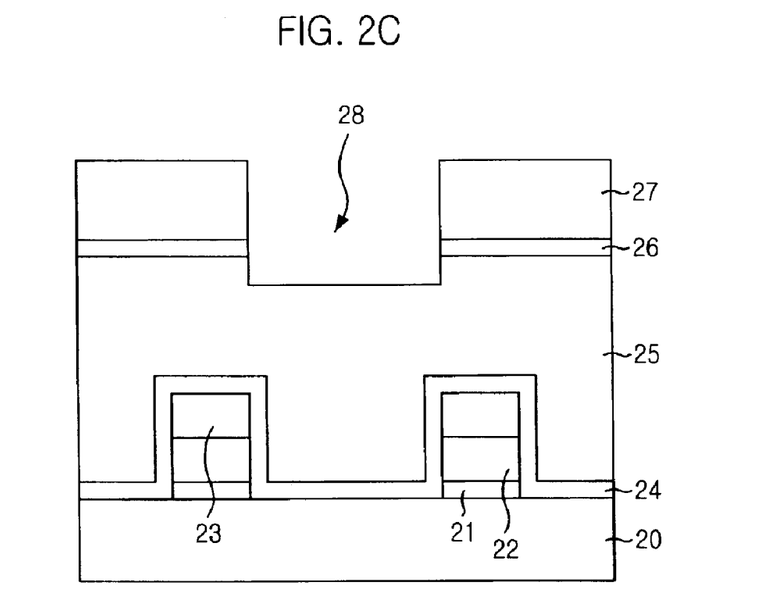

With reference to FIG. 2C, the inter-layer insulating layer 25 exposed through the use of the photoresist pattern 27 and the organic anti-reflective coating layer 26 as the etch mask is selectively etched to form a first opening part 28 that defines an area for a contact hole pattern.

At this time, $C_xF_y$ gas where x and y are integers ranging from 1 to 10 is used. It is very important to obtain a vertical etch profile to minimize deformations of the photoresist pattern 27.

Therefore, in the preferred embodiment, CF4 gas is selected among $C_xF_y$ gas as an appropriate gas for selectively etching the organic anti-reflective coating layer 26 and the oxide based inter-layer insulating layer 25. Also, $O_2$ is additionally added to the selected $CF_4$ gas to induce a combination of C and $O_2$ during the etching process and then remove C in a CO or $CO_2$ form. As a result of reducing minimally etch remnants, a contact hole pattern is duplicated on the etch target, i.e., the inter-layer insulating layer 25 through acquired vertical etch-profile.

The process recipe for forming a contact hole will be described in more detail.

A pressure within the chamber is maintained in a range from about 10 mtorr to about 30 mTorr. Each of flow quantity of the $CF_4$ and $O_2$ ranges from about 50 sccm to about 150 sccm and from about 1 sccm to 5 sccm, respectively. Also, about 400 W to about 600 W of power is used. Moreover, a temperature of a cathode within the chamber is maintained in a range from about 15° C. to about 30° C.

Figure 2D:
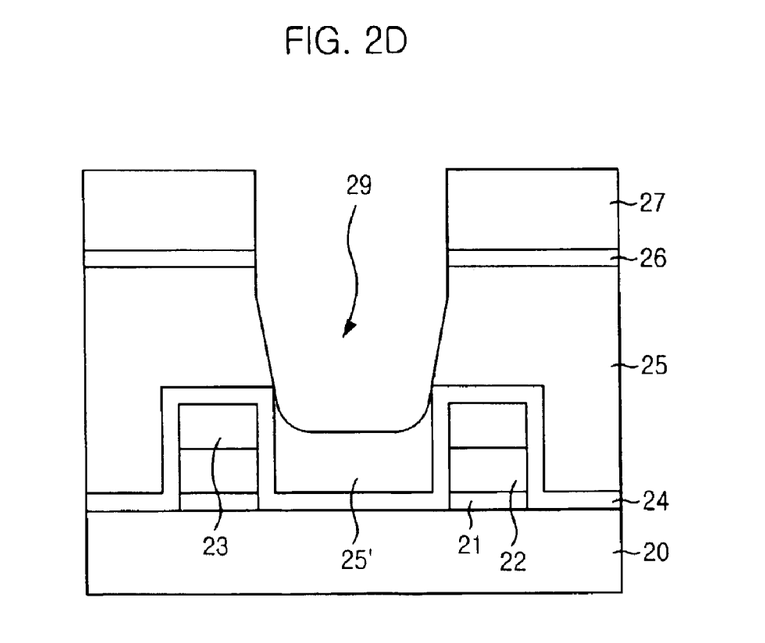

Referring to FIG. 2D, the inter-layer insulating layer 25 of which top portion is partially etched is etched by using the photoresist pattern 27 and the organic anti-reflective coating layer 26 as an etch mask so to form a second opening part 29 partially remaining on top of the etch stop layer 24.

A reference numeral 25' represents the inter-layer insulating layer 25 partially remaining on top of the etch stop layer 24.

At this time, $C_xF_y$ and $C_aH_bF_c$ gas, where a,b and C are integers from 1 to 10 are used. Also, it is very important to acquire a good etch profile by etching the inter-layer insulating layer 25 along the first opening part 28 defining the contact hole pattern so to minimize deformations of the photoresist pattern 27. In the preferred embodiment of the present invention, about ¾ of the total thickness of the inter-layer insulating layer 25 is practically etched, and a remaining thickness of the inter-layer insulating layer 25' is set to be within about 500 Å.

Therefore, among suggested $C_xF_y$ and $C_aH_bF_c$ gas, $C_4F_6$ and $CH_2F_2$ gas are selected for etching the inter-layer insulating layer 25. Such inert gas as He, New, Ar or Xe and additional $O_2$ gas are used to obtain repeatability of the etching process and a good etch profile.

More detailed process recipe will be described in accordance with the preferred embodiment of the present invention.

A pressure within the chamber is maintained in a range from about 70 mtorr to about 100 mTorr. A flow quantity of the $C_4F_6$ ranges from about 5 sccm to about 15 sccm and that of the $CH_2F_2$ ranges from about 1 sccm to 5 sccm. Also, the $O_2$ and inert gas use each flow quantity ranging from about 1 sccm to about 6 sccm and from about 200 sccm to about 600 sccm, respectively. In addition, about 400 W to about 600 W of power is used. Moreover, a temperature of a cathode within the chamber is maintained in a range from about 15° C. to about 30° C.

Next, the remaining inter-layer insulating layer 25' contacting to the etch stop layer 24 is removed by using gas including the $C_xF_y$ so that a second opening part 30 exposing the etch stop layer 24 is formed. This preferred embodiment employs particularly $C_4F_6$ gas with a consideration of etch properties of oxide and nitride layers.

Concretely, a pressure within the chamber is maintained in a range from about 50 mTorr to about 100 mTorr. The $C_4F_6$ gas has a flow quantity ranging from about 5 sccm to about 15 sccm while the added $O_2$ has a flow quantity ranging from about 1 sccm to about 8 sccm. Also, the inert gas has a flow quantity ranging from about 200 sccm to about 600 sccm. Moreover, a power ranging from about 700 W to about 1500 W is used. A temperature of a cathode within the chamber is maintained within a range between about 15° C. and about 30° C.

Figure 2E:
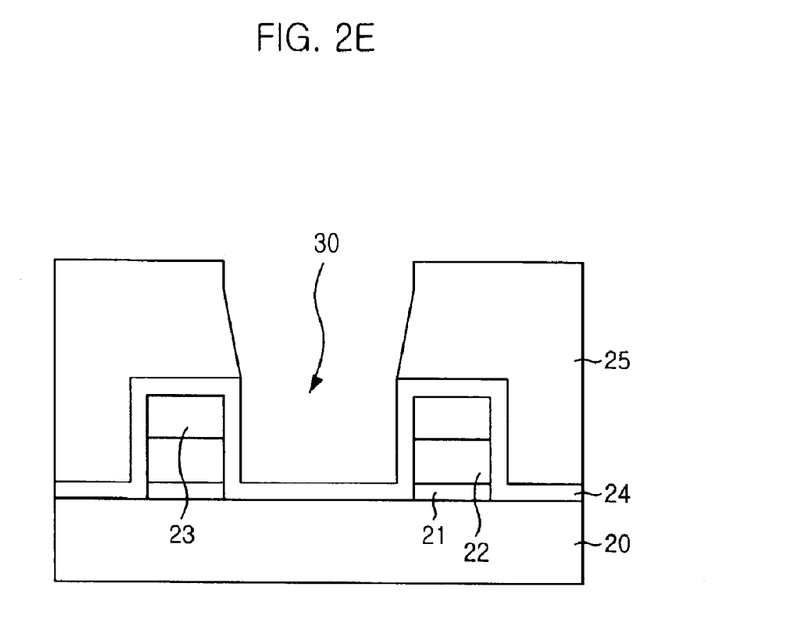

Continuous to the process recipe, the photoresist pattern 27 is removed. As known, since a photoresist strip process uses $O_2$ plasma, it is possible to easily remove the organic anti-reflective coating layer 25 without an additional process while proceeding the photoresist strip process. Then, etch remnants remaining at lower and lateral sides of the third opening part 30 are removed by employing a typical cleaning process. FIG. 2E shows a cross-sectional view completed with the cleaning process.

The etch stop layer 24 is selectively etched to expose a surface of the substrate 20, thereby forming a predetermined number of patterns. In this preferred embodiment, a number of contact hole patterns around the gate electrodes are illustrated. The following will explain the contact hole pattern formation with reference to FIGS. 2F to 2H.

Figure 2F:
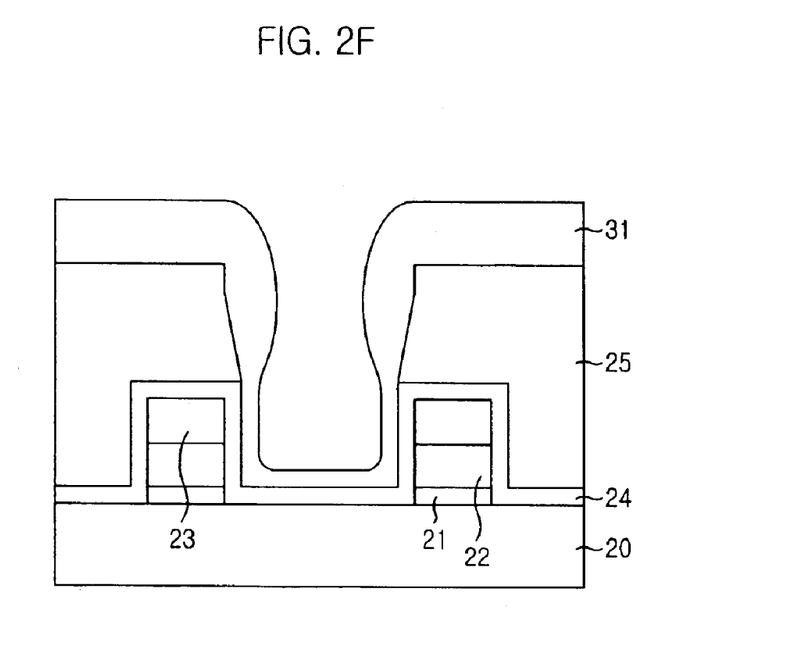
Figure 2G:
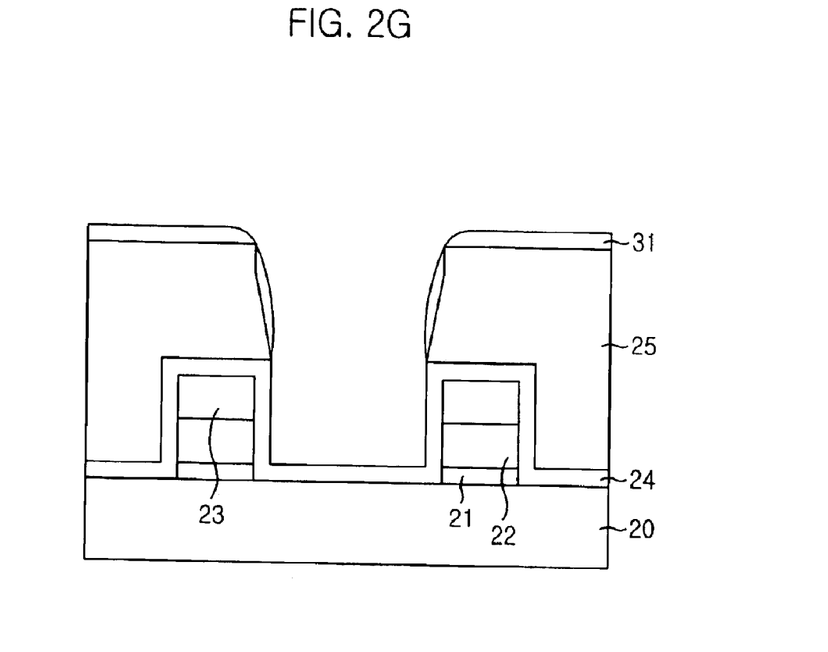
Figure 2H:
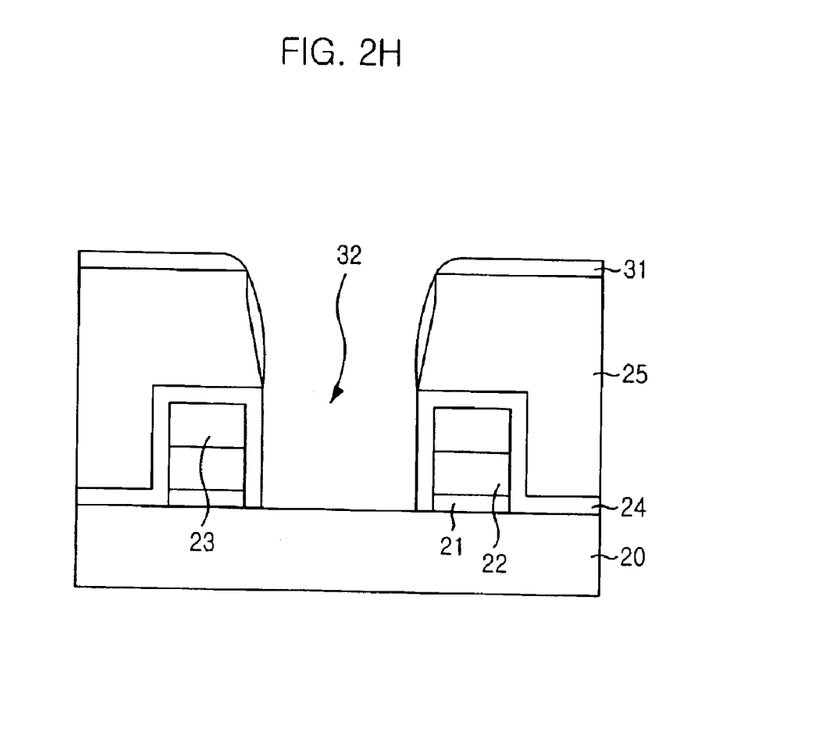

Referring to FIG. 2F, an oxide layer 31 having a poor step coverage is deposited on top of the above entire structure including the third opening part 30. As illustrated in FIG. 2G, a wet etching process is performed to expand an exposed area of the upper etch stop layer 24. Referring to FIG. 2H, the oxide layer 31 is removed through a dry etching, and the etch stop layer 24 is also removed completing a process for forming a contact hole exposing the surface of the substrate 20.

Herein, the oxide layer 31 has a poor step coverage resulting that a thickness of the oxide layer 31 deposited on top of the etch stop layer 24 is more thinner compared to that of the oxide layer 31 deposited on top of the inter-layer insulating layer 25. A tetra ethyl ortho silicate (TEOS) layer is a representative of the oxide layer 31. The reason for having different deposition thickness is to prevent an attack on an upper side of the inter-layer insulating layer 25 during the wet etching process for expanding a contact area while forming the contract hole 32 and the dry etching process for removing the etch stop layer 24.

After depositing the oxide layer 31, a typical wet etching process is proceeded to expand the contact area on top of the exposed etch stop layer 24.

The dry etching process is performed to make an electric connection to the bottom substrate 20 by removing the contact area, that is, the oxide layer 31 partially remaining on top of the exposed etch stop layer 24 and the etch stop layer 24.

In the above process for removing the remaining oxide layer 31, a pressure ranging from about 10 mTorr to about 50 mTorr is used. Also, each flow quantity of $C_4F_8$ and $CH_2F_2$ ranges from about 5 sccm to about 20 sccm. A flow quantity of the inert gas ranging from about 200 sccm to about 600 sccm is used. Moreover, a power ranging from about 1000 W to about 2000 W is used.

The dry etching process for exposing the surface of the substrate 20 through a removal of the etch stop layer 24 is performed. At this time, a pressure ranging from about 20 mTorr to about 50 mTorr and a power ranging from about 400 W to about 600 W are used. Also, each flow quantity of $CF_4$ and $CHF_3$ ranges from about 5 sccm to about 20 sccm, and a flow quantity of the inert gas ranging from about 100 sccm to about 200 sccm is also used.

The contact hole pattern 32 in accordance with the preferred embodiment of the present invention plays an important role in a semiconductor device by being connected to an active area of the substrate, a bit line or a storage node through a conductive material electrically connected to the substrate 20. Also, the contact hole pattern 32 prevents increases of a contact open defect and contact resistance, thereby improving leakage current characteristic.

By following the provided preferred embodiments of the present invention, it is possible to minimize deformations of the photoresist pattern for ArF. Particularly, as described above, the present invention provides an effect of preventing increases of the contact open defect and contact resistance so to ultimately improve yields of semiconductor devices.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device with use of an ArF light source, comprising the steps of:

forming an etch stop layer and an insulating layer sequentially on a substrate;

forming an anti-reflective coating layer on top of the insulating layer;

forming a photoresist pattern on the anti-reflective coating layer by performing a photo-etching process using a photoresist and a ArF light source;

exposing the insulating layer by etching the anti-reflective coating layer through the use of the photoresist pattern as an etch mask;

etching selectively a partial portion of the exposed insulating layer by using gas including $C_xF_y$ where x and y are integers ranging from 1 to 10;

etching selectively the insulating layer until the partial portion of the insulating layer is remained on top of the etch stop layer by using gas including $C_xF_y$ and $C_aH_bF_c$ where a, b, and c are integers ranging from 1 to 10;

removing the remaining insulating layer by using gas including $C_xF_y$; and removing selectively the etch stop layer and exposing a surface of the substrate so to form a predetermined number of patterns.

2. The method as recited in claim 1, wherein the insulating layer includes an oxide layer, and the etch stop layer includes a nitride layer.

3. The method as recited in claim 1, wherein the insulating layer is etched to ¾ of the total thickness of the insulating layer at the step of etching the insulating layer until the partial portion of the insulating layer is remained on top of the etch stop layer.

4. The method as recited in claim 2, wherein the $C_xF_y$ is $CF_4$ at the step of etching the partial portion of the insulating layer.

5. The method as recited in claim 4, wherein the step of etching the partial portion of the insulating layer uses a pressure ranging from about 10 mTorr to about 50 mTorr, a flow quantity of $CF_4$ ranging from about 50 sccm to about 150 sccm, a flow quantity of $O_2$ ranging from about 1 sccm to about 5 sccm and a power ranging from about 400 W to about 600 W.

6. The method as recited in claim 2, wherein the $C_xF_y$ is $C_4F_6$ and the $C_aH_bF_c$ is $CH_2F_2$ at the step of etching the insulating layer until the partial portion of the insulating layer is remained on top of the etch stop layer.

7. The method as recited in claim 6, wherein the step of etching the insulating layer until the partial portion of the insulating layer is remained on top of the etch stop layer uses a pressure ranging from about 70 mTorr to about 100 mTorr, a power ranging from about 700 W to about 1500 W, a flow quantity of $C_4F_6$ ranging from about 5 sccm to about 15 sccm, a flow quantity of $O_2$ ranging from about 1 sccm to about 6 sccm, a flow quantity of $CH_2F_2$ ranging from about 1 sccm to 5 sccm and a flow quantity of inert gas ranging from about 200 sccm to about 600 sccm.

8. The method as recited in claim 2, wherein the $C_xF_y$ is $C_4F_6$ at the step of removing the remaining insulating layer.

9. The method as recited in claim 8, wherein the step of removing the remaining insulating layer uses a pressure ranging from about 50 mTorr to about 100 mTorr, a flow quantity of $C_4F_6$ ranging from about 5 sccm to about 15 sccm, a flow quantity of $O_2$ ranging from about 1 sccm to about 8 sccm, a flow quantity of inert gas ranging from about 200 sccm to about 600 sccm and a power ranging from about 700 W to about 1500 W.

10. The method as recited in claim 1, wherein the step of removing the remaining insulating layer includes further the step of removing the photoresist pattern and performing a subsequent cleaning process.

11. The method as recited in claim 2, wherein the step of removing the etch stop layer includes the steps of:

depositing an oxide layer having a poor step coverage on top of an entire structure with the exposed etch stop layer;

expanding an upper exposed area of the etch stop layer through a wet etching process;

removing the oxide layer on the etch stop layer through a dry etching process; and removing selectively the etch stop layer.

12. The method as recited in claim 11, wherein the oxide layer is a tetra ethyl ortho silicate (TEOS) layer.

13. The method as recited in claim 11, wherein the step of removing the oxide layer uses a pressure ranging from about 10 mTorr to about 50 mTorr, a flow quantity of $C_4F_8$ ranging from about 5 sccm to about 20 sccm, a flow quantity of $CH_2F_2$ ranging from about 5 sccm to about 20 sccm, a flow quantity of inert gas ranging from about 200 sccm to about 600 sccm and a power ranging from about 1000 W to about 2000 W.

14. The method as recited in claim 11, wherein the step of removing the etch stop layer uses a pressure ranging from about 20 mTorr to about 50 mTorr, a flow quantity of $CF_4$ ranging from about 5 sccm to about 20 sccm, a flow quantity of $CHF_3$ ranging from about 5 sccm to about 20 sccm, a flow quantity of inert gas ranging from about 100 sccm to about 200 sccm and a power ranging from about 400 W to about 600 W.

15. The method as recited in claim 1, wherein the anti-reflective coating layer uses an organic based material.

16. The method as recited in claim 15, wherein the step of etching the anti-reflective coating layer uses a pressure ranging from about 25 mTorr to about 75 mTorr, a flow quantity of $CF_4$ ranging from about 60 sccm to about 120 sccm, a flow quantity of $O_2$ ranging from about 10 sccm to about 30 sccm, a flow quantity of CO ranging from about 10 sccm to about 30 sccm and a power ranging from about 200 W to about 400 W.

17. The method as recited in claim 4, wherein a temperature of a cathode within a chamber is maintained in a range from about 15° C. to about 30° C. at each of the etching steps.

18. The method as recited in claim 1, wherein the photoresist pattern has a circular shape, a bar type or T-type shape in respect of a plane level.

19. The method as recited in claim 1, wherein the photoresist for ArF includes cycloolefin-maleic anhydiride (COMA) or acrylate.

20. A method for fabricating a semiconductor device with using an ArF light source, comprising the steps of:
   forming sequentially an insulating layer and an anti-reflective coating layer on a substrate providing a number of neighboring conductive patterns;
   forming a photoresist pattern defining a contact area on the anti-reflective coating layer by performing a photo-etching process using an ArF light source;
   forming a first opening part exposing a surface of the insulating layer by etching the anti-reflective coating layer with use of the photoresist pattern as an etch mask;
   forming a second opening part by etching the exposed insulating layer to a partial thickness with use of a mixed gas of $C_5F_8/O_2/Ar$ and the photoresist pattern as an etch mask; and
   forming a third opening part exposing a surface of the substrate between the conductive patterns by etching the remaining insulating layer with use of a mixed gas of $C_5F_8/CH_2F_2/O_2/Ar$ and the photoresist pattern as an etch mask.

21. The method as recited in claim 20, wherein the step of forming the second opening part uses each flow quantity of $C_5F_8$ and $O_2$ ranging from about 10 sccm to about 30 sccm and a flow quantity of Ar ranging from about 500 sccm to about 1500 sccm.

22. The method as recited in claim 21, wherein the step of forming the second opening part uses a pressure ranging from about 20 mTorr to about 100 mTorr and a power ranging from about 100 W to about 1800 W.

23. The method as recited in claim 20, wherein the step of forming the third opening part uses the $C_5F_8$, $O_2$ and $CH_2F_2$ each having a flow quantity ranging from about 10 sccm to about 30 sccm and Ar having a flow quantity ranging from about 500 sccm to about 1500 sccm.

24. The method as recited in claim 23, wherein the step of forming the third opening part uses a pressure ranging from about 20 mTorr to about 100 mTorr and a power ranging from about 800 W to about 1400 W.

25. The method as recited in claim 20, wherein the step of forming the first opening part uses $CF_4/O_2$ or $N_2/O_2$ gas.

26. The method as recited in claim 25, wherein the $CF_4$ has a flow quantity ranging from about 50 sccm to about 200 sccm and the $O_2$ has a flow quantity ranging from about 1 sccm to about 50 sccm.

27. The method as recited in claim 26, wherein the step of forming the first opening part uses a pressure ranging from about 20 mTorr to about 100 mTorr and a power ranging from about 300 W to about 1000 W.

28. The method as recited in claim 25, wherein the $N_2$ has a flow quantity ranging from about 100 sccm to about 200 sccm and the $O_2$ has a flow quantity ranging from about 1 sccm to about 50 sccm.

29. The method as recited in claim 28, wherein the step of forming the first opening part uses a pressure ranging from about 1 mTorr to about 100 mTorr and a power ranging from about 300 W to about 1000 W.

30. The method as recited in claim 20, wherein a lower side of the second opening part has a height identical to an upper side of the conductive pattern at the step of forming the second opening part.

* * * * *